United States Patent
Chen et al.

(10) Patent No.: US 7,816,227 B2
(45) Date of Patent: Oct. 19, 2010

(54) TAPERED THROUGH-SILICON VIA STRUCTURE

(75) Inventors: Chen-Shien Chen, Zhubei (TW); Chen-Cheng Kuo, Chu-Pei (TW); Kai-Ming Ching, Jhudong Township (TW); Chih-Hua Chen, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/495,124

(22) Filed: Jun. 30, 2009

(65) Prior Publication Data

US 2009/0269905 A1 Oct. 29, 2009

Related U.S. Application Data

(63) Continuation of application No. 11/803,783, filed on May 16, 2007, now Pat. No. 7,564,115.

(51) Int. Cl.
*H01L 21/76* (2006.01)
*H01L 21/44* (2006.01)

(52) U.S. Cl. .................. 438/424; 438/637; 438/667; 257/E21.597

(58) Field of Classification Search .............. 438/424, 438/637, 640, 667; 257/E21.546, E21.585, 257/E21.597
See application file for complete search history.

(56) References Cited

U.S. PATENT DOCUMENTS

| | | | |
|---|---|---|---|
| 5,545,581 A * | 8/1996 | Armacost et al. | 438/631 |
| 6,399,472 B1 | 6/2002 | Suzuki et al. | |
| 6,448,657 B1 | 9/2002 | Dorleans | |
| 7,264,986 B2 * | 9/2007 | Gogoi | 438/52 |
| 7,589,008 B2 * | 9/2009 | Kirby | 438/612 |
| 2005/0017322 A1 | 1/2005 | Gau et al. | |
| 2007/0262464 A1 | 11/2007 | Watkins et al. | |
| 2009/0191708 A1 * | 7/2009 | Kropewnicki et al. | 438/667 |

* cited by examiner

*Primary Examiner*—Tuan N. Quach
(74) *Attorney, Agent, or Firm*—Slater & Matsil, L.L.P.

(57) ABSTRACT

An integrated circuit structure includes a substrate; a through-silicon via (TSV) in the substrate, the TSV being tapered; a hard mask region extending from a top surface of the substrate into the substrate, wherein the hard mask encircles a top portion of the TSV; dielectric layers over the substrate; and a metal post extending from a top surface of the dielectric layers to the TSV, wherein the metal post comprises same materials as the TSV.

20 Claims, 11 Drawing Sheets

TAPERED THROUGH-SILICON VIA STRUCTURE

This application is a continuation of U.S. patent application Ser. No. 11/803,783, entitled "Tapered Through-Silicon Via Structure," filed on May 16, 2007, U.S. Pat. No. 7,564,115 which application is incorporated herein by reference.

TECHNICAL FIELD

This invention relates generally to through-silicon vias, and more particularly to structures and manufacturing methods of through-silicon vias with tapered profiles.

BACKGROUND

Since the invention of integrated circuits, the semiconductor industry has experienced continuous rapid growth due to constant improvements in the integration density of various electronic components (i.e., transistors, diodes, resistors, capacitors, etc.). For the most part, this improvement in integration density has come from repeated reductions in minimum feature size, allowing more components to be integrated into a given chip area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limitations to the density that can be achieved in two dimensions. One of these limitations is the minimum size needed to make these components. Also, when more devices are put into one chip, more complex designs are required.

An additional limitation comes from the significant increase in the number and length of interconnections between devices as the number of devices increases. When the number and length of interconnections increase, both circuit RC delay and power consumption increase.

Figure 1:
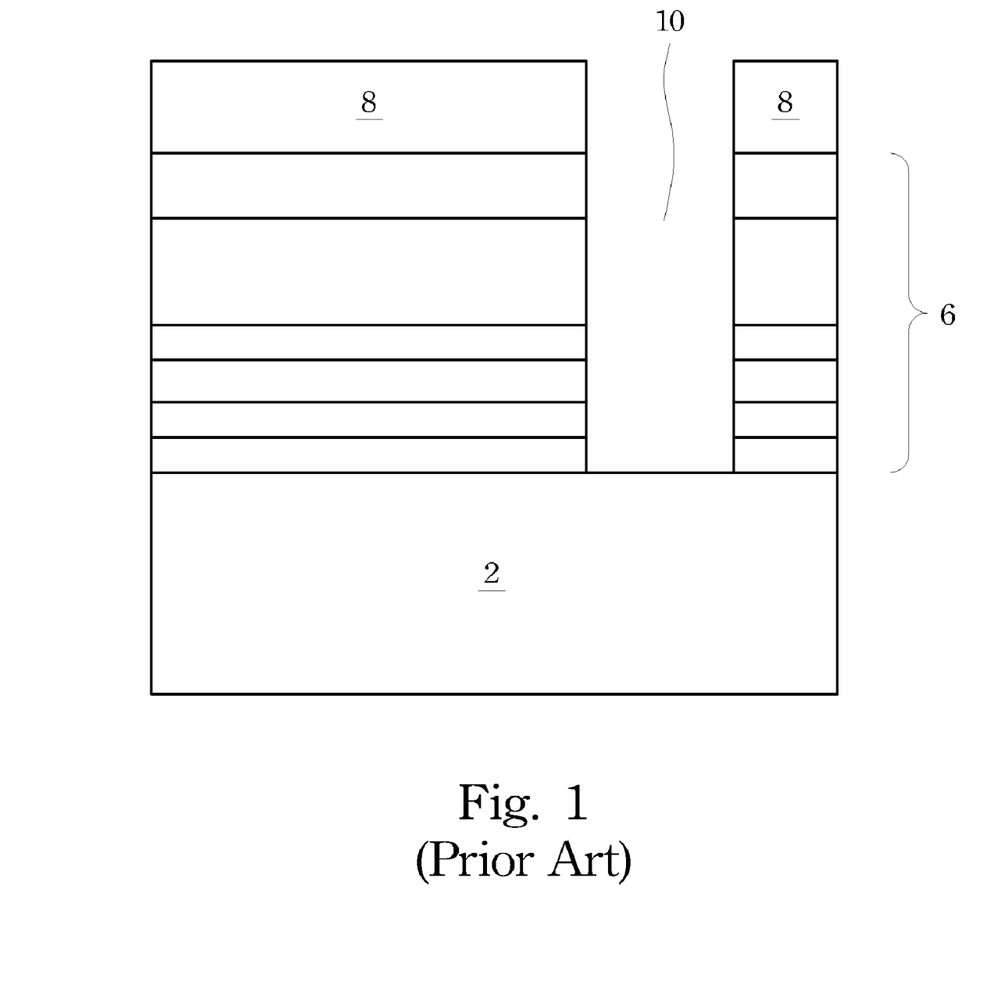
FIGS. 1 and 2 illustrate cross-sectional views of a conventional through-silicon via formation process.
Figure 2:
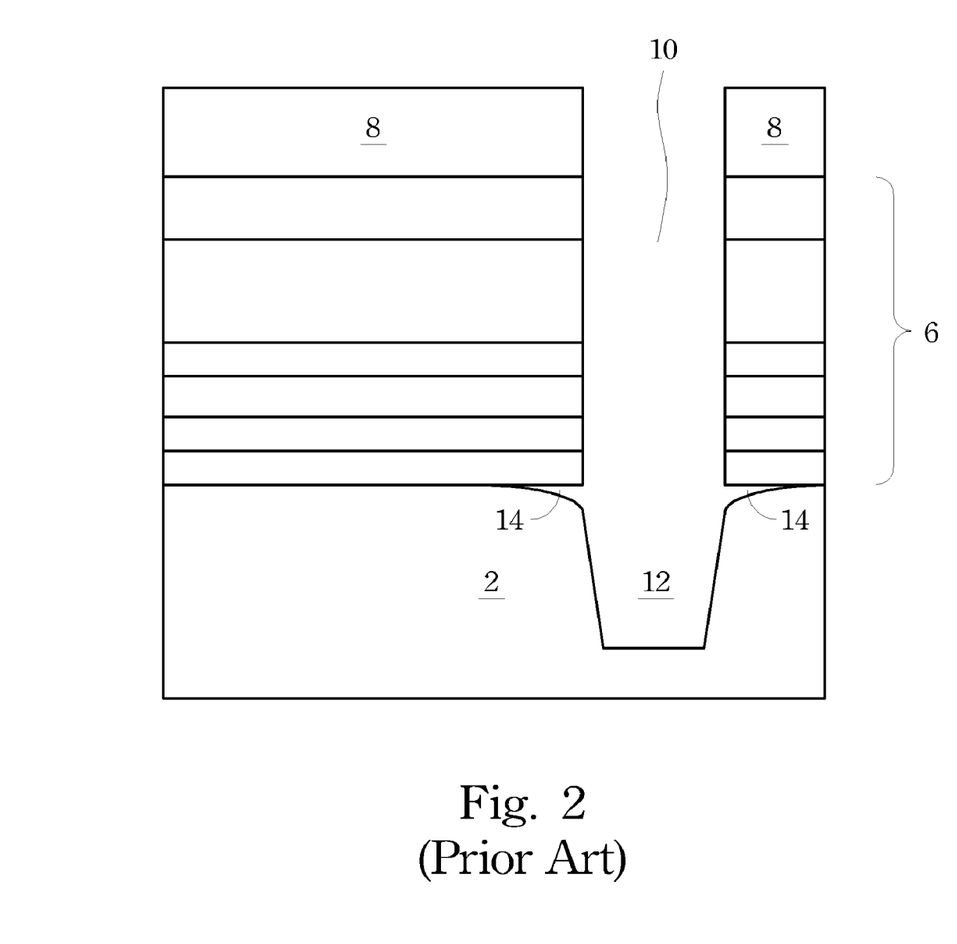

Among the efforts for resolving the above-discussed limitations, three-dimensional integrated circuit (3DIC) and stacked dies are commonly used. Through-silicon vias (TSV) are often used in 3DIC and stacked dies for connecting dies. FIGS. 1 and 2 illustrate a conventional method for forming TSVs. Referring to FIG. 1, silicon substrate 2 is provided, on which integrated circuits (not shown) are formed. Dielectric layers 6, in which metal lines and vias (not shown) are formed, are then formed layer-by-layer over silicon substrate 2. Photo resist 8 is then applied and patterned. Opening 10 is formed through dielectric layers 6, exposing silicon substrate 2. Silicon substrate 2 is then etched through opening 10, forming opening 12, as shown in FIG. 2. A glue layer and/or a diffusion barrier layer (not shown) are formed on the sidewalls and the bottom of openings 10 and 12. Copper (not shown) is then filled by plating to form a through-silicon via.

The conventional TSV formation process suffers drawbacks. Since openings 10 and 12 are very deep compared to their width, the glue layer and the diffusion barrier layer have poor coverage on sidewalls of openings 10 and 12. Furthermore, it is hard to form void-free TSVs. Accordingly, the plating current for filling copper into openings 10 and 12 has to be reduced in order to reduce the likelihood of voids in TSVs, and hence the throughput is reduced.

To solve the above-discussed problems, openings 10 and 12, particularly opening 12, preferably have tapered profiles with upper portions wider than lower portions. This may be achieved by adjusting the etching recipe to increase lateral etching. However, this approach causes severe undercuts 14 underlying dielectric layers 6. Undercuts 14 cause the breaking in the subsequently formed diffusion barrier layer and a seed copper layer, and hence adversely affect the subsequent plating of copper.

Accordingly, what is needed in the art is a TSV structure and method for forming the same that take advantage of tapered profile of TSVs, while at the same time not incurring serious undercuts.

SUMMARY OF THE INVENTION

In accordance with one aspect of the present invention, an integrated circuit structure includes a substrate; a through-silicon via (TSV) in the substrate, the TSV being tapered; a hard mask region extending from a top surface of the substrate into the substrate, wherein the hard mask encircles a top portion of the TSV; dielectric layers over the substrate; and a metal post extending from a top surface of the dielectric layers to the TSV, wherein the metal post comprises same materials as the TSV.

In accordance with another aspect of the present invention, an integrated circuit structure includes a substrate; a shallow trench isolation (STI) region extending from a top surface of the substrate into the substrate, the STI region forming a ring; a polysilicon ring on the STI region; low-k dielectric layers over the substrate and the polysilicon ring; and a conductive feature extending from a top surface of the low-k dielectric layers into the substrate. The conductive feature includes a first portion in the low-k dielectric layers, and a second portion penetrating through the polysilicon ring and the ring of the STI region.

In accordance with yet another aspect of the present invention, a method for forming an integrated circuit structure includes providing a substrate; forming a hard mask extending from a top surface of the substrate into the substrate; forming an etch stop plate on the hard mask; forming low-k dielectric layers over the substrate and the etch stop plate; and forming a conductive feature extending from a top surface of the low-k dielectric layers into the substrate. The conductive feature includes a first portion in the low-k dielectric layers, and a second portion penetrating through the etch stop plate and the hard mask.

In accordance with yet another aspect of the present invention, a method for forming an integrated circuit structure includes providing a substrate; forming an STI region extending from a top surface of the substrate into the substrate, wherein the STI region encircles a top portion of the substrate; forming a plate on the substrate and the STI region, wherein the plate covers the top portion of the substrate encircled by the STI region; forming dielectric layers over the substrate, the STI region and the plate; forming an opening in the dielectric layers using the plate as an etch stop layer, wherein an inner portion of the plate is exposed through the opening; and etching the plate and the substrate through the opening.

The advantageous features of the present invention include tapered TSVs, reduced undercuts, and improved sidewall coverage of diffusion barrier layers.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel through-silicon via (TSV) structure and the methods of forming the same are provided. The intermediate stages of manufacturing a preferred embodiment of the present invention are illustrated. The variations of the preferred embodiments are then discussed. Throughout the various views and illustrative embodiments of the present invention, like reference numbers are used to designate like elements.

Figure 3A:
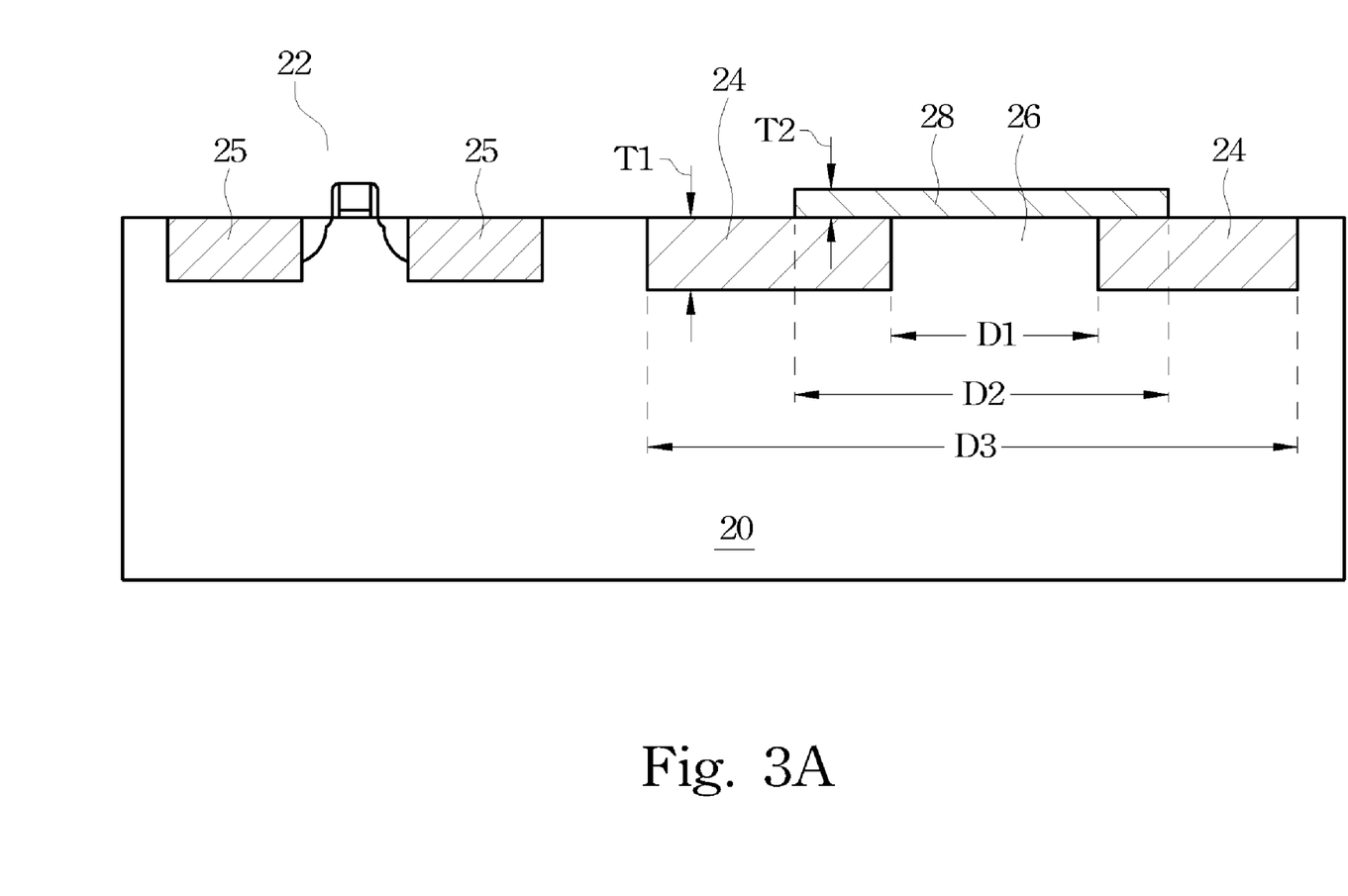
FIGS. 3 through 9 are cross-sectional views and top views of intermediate stages in the manufacturing of an embodiment of the present invention.

Referring to FIG. 3A, substrate 20, which is preferably a silicon substrate, is provided. Substrate 20 may also be formed of other semiconductor materials containing group III, group IV, and/or group V elements. In addition, substrate 20 may be in the form of bulk semiconductor, strained semiconductor, and the like. Integrated circuits 22, which are symbolized using a transistor, may be formed at the surface of substrate 20.

Shallow trench isolation (STI) region 24 is formed in substrate 20, preferably by etching shallow trenches in substrate 20 and filling the trenches with an insulator. An exemplary insulator includes high-density plasma (HDP) silicon oxide. In an embodiment, STI region 24 is formed simultaneously with the formation of STI regions 25, which are used for isolating active devices. Alternatively, STI region 24 and STI regions 25 are separately formed so that STI region 24 may have an optimized thickness T1 different from the thickness of STI regions 25. In an exemplary embodiment, thickness T1 is less than about 1 µm, and more preferably between about 0.3 µm and about 0.4 µm. One skilled in the art will realize, however, that the dimensions recited throughout the description are merely examples, and can be scaled with the scaling of the formation technology. For simplicity, integrated circuits 22 and STI regions 25 are not shown in the following drawings.

Figure 3B:
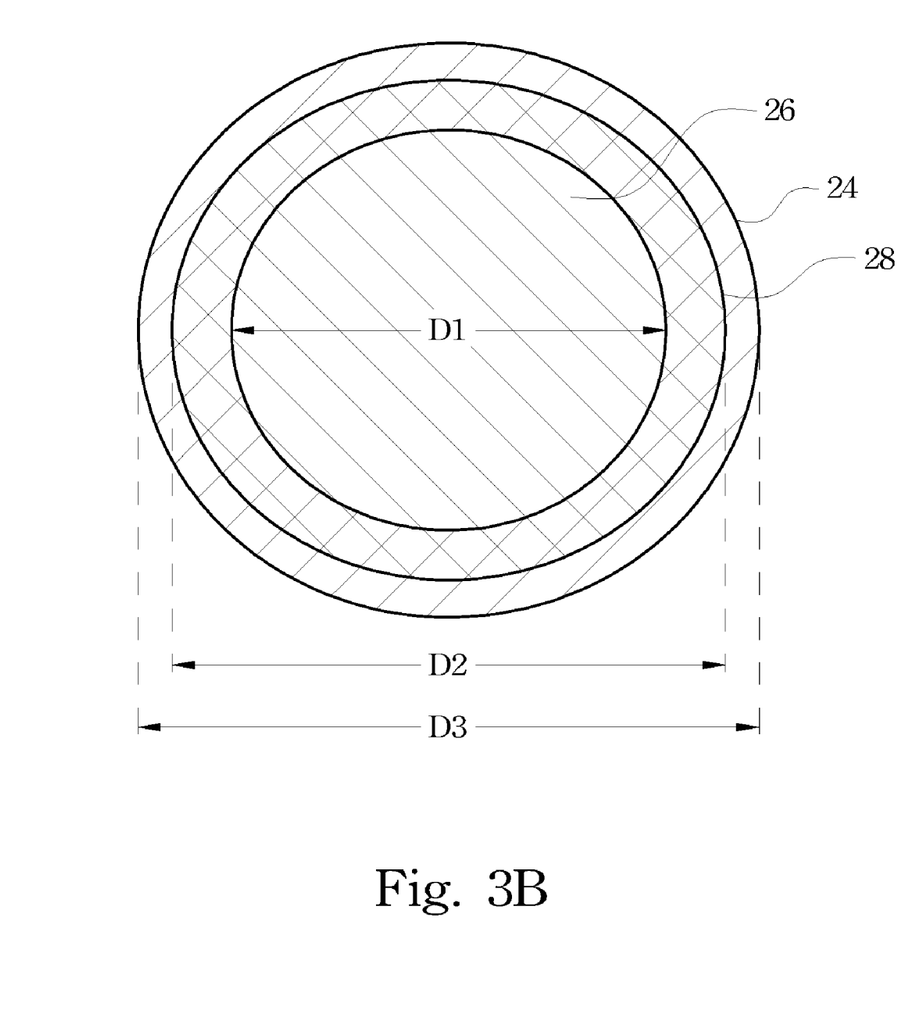

FIG. 3B illustrates a top view of a portion of the structure shown in FIG. 3A. In the preferred embodiment, STI region 24 forms a ring encircling hole 26. The diameter D1 of hole 26 depends on the desired dimension of the resulting TSV. In an exemplary embodiment, diameter D1 is between about 20 µm and about 30 µm. In alternative embodiments, hole 26 may have other shapes, such as a square. Throughout the description, diameter D1 is alternatively referred to as a width.

Referring back to FIG. 3A, polysilicon plate 28 is formed on substrate 20 and STI region 24, and covering hole 26. The thickness T2 of polysilicon plate 28 is preferably small, for example, less than about 1 µm, and more preferably between about 0.3 µm and about 0.4 µm.

Polysilicon plate 28 preferably fully covers hole 26. Accordingly, polysilicon plate 28 is preferably a circular plate having diameter D2 of greater than the diameter D1 of hole 26. In addition, diameter D2 is less than the outer diameter D3 of STI region 24, although D2 may be greater than D3. A difference ΔD between D2 and D1 is preferably greater than about 10 µm.

Figure 4A:
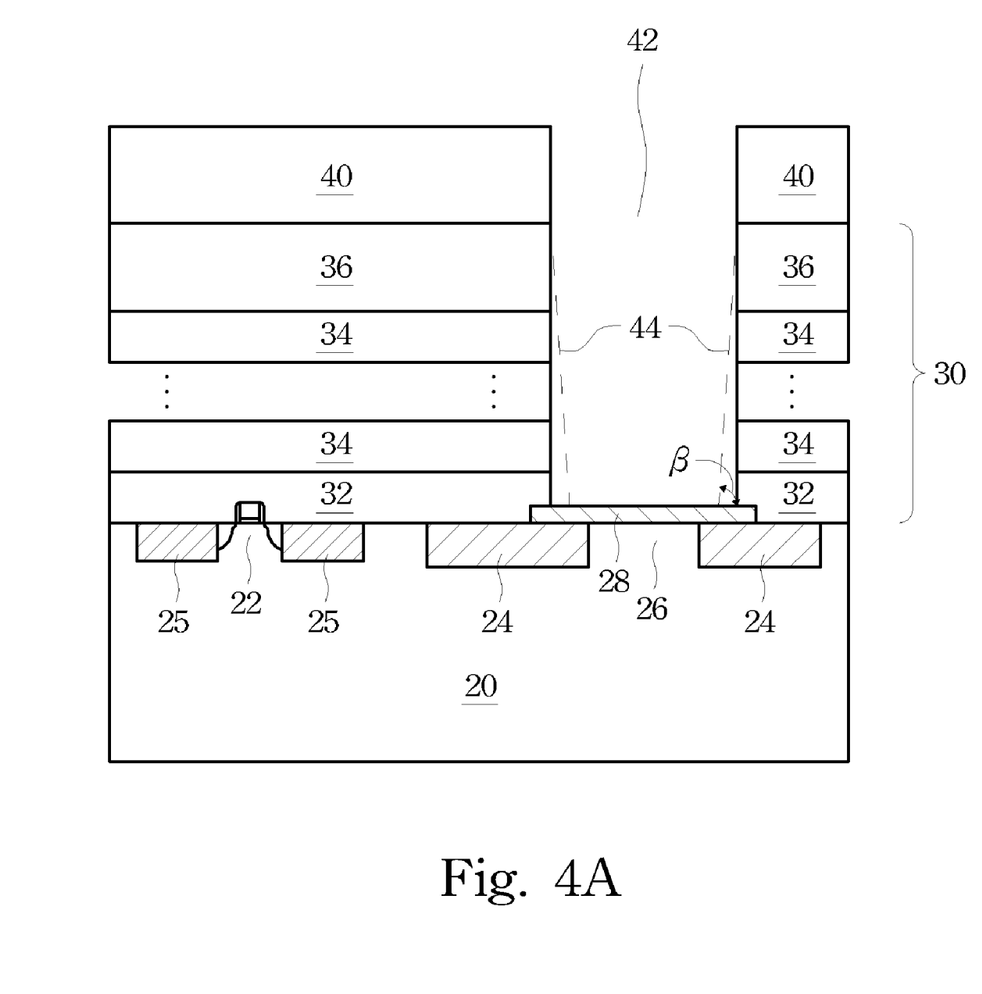

Referring to FIG. 4A, interconnect structure 30 is formed. Interconnect structure 30 includes an etch stop layer (ESL, not shown) blanket formed over integrated circuits 22, substrate 20, STI region 24 and polysilicon plate 28. Inter-layer dielectric (ILD) 32 is formed over the ESL. Inter-metal dielectric (IMD) layers 34, which are preferably formed of low-k dielectric layers, are formed layer-by-layer over ILD 32, and metal lines and vias (not shown) are formed in IMD layers 34. Passivation layer 36 is formed over IMD layers 34. Additional ESLs (not shown) may be formed between IMD layers 34. The formation processes of interconnect structure 30 is well known in the art, and thus are not repeated herein.

Photo resist 40 is formed over interconnect structure 30, and is then patterned to form opening 42. Opening 42 extends through dielectric layers 32, 34 and 36, exposing polysilicon plate 28. In the formation of opening 42, polysilicon plate 28 acts as an etch stop layer. In an embodiment, opening 42 is substantially straight, which may be achieved by an anisotropic etching. In other embodiments, opening 42 has a substantially tapered profile, as is illustrated by broken lines 44. The tilt angle β is preferably less than about 89 degrees, and more preferably between about 87 degrees and about 88 degrees. The formation of the tapered profile may be achieved by making the etching partially anisotropic and partially isotropic.

Figure 4B:
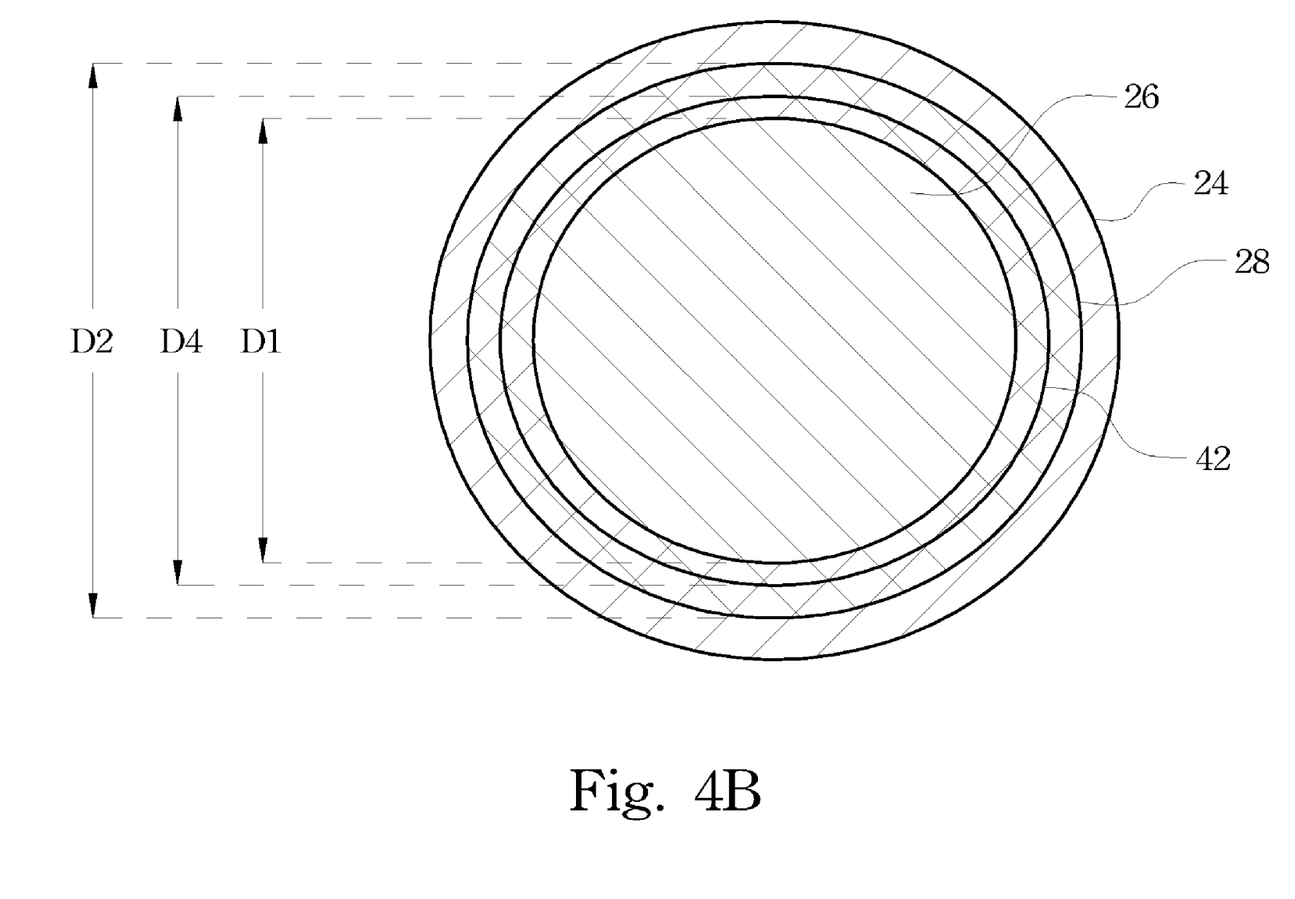

FIG. 4B illustrates a top view of the structure shown in FIG. 4A. Opening 42 preferably has a same shape as hole 26. In the preferred embodiment, hole 26 is circular, and hence the top view of opening 42 is circular. Diameter D4 of opening 42 is preferably greater than diameter D1 of hole 26, but less than diameter D2 of polysilicon plate 28. More preferably, Diameter D4 is greater than diameter D1 by greater than about 10 µm.

Figure 5:
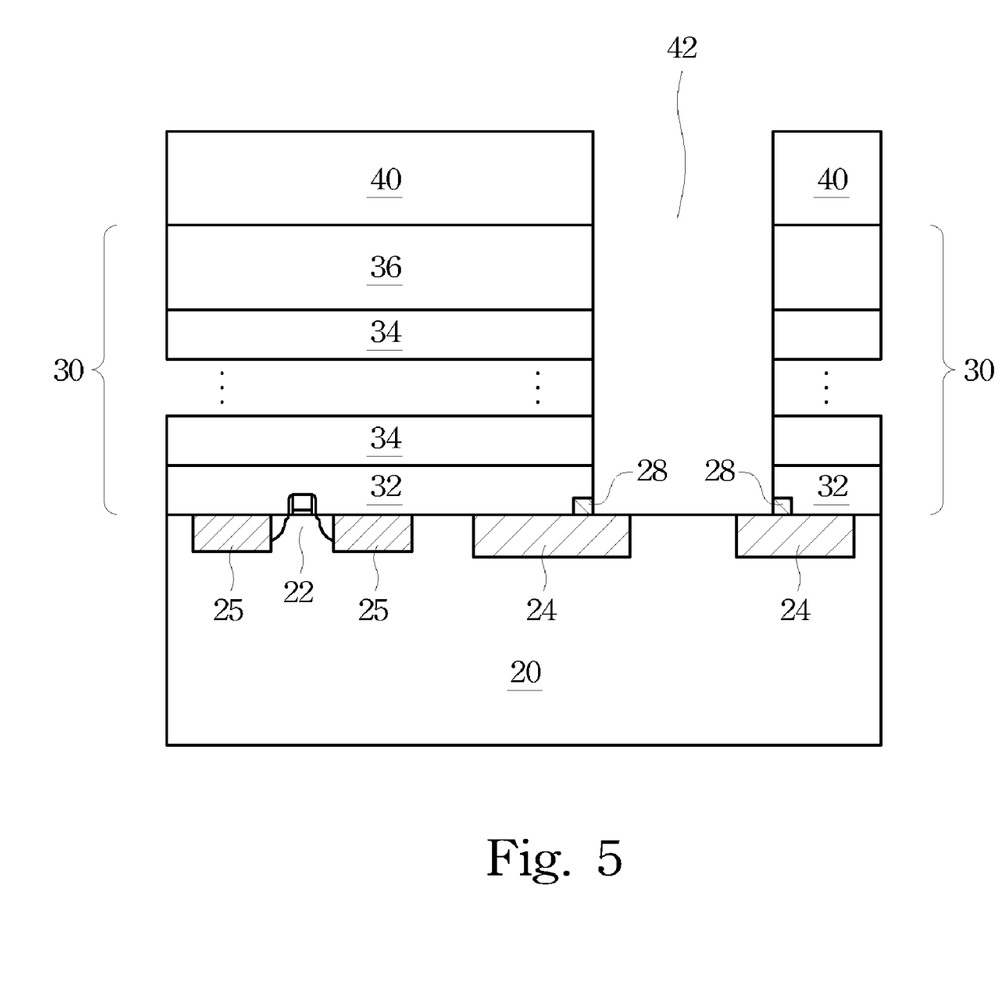
Figure 6:
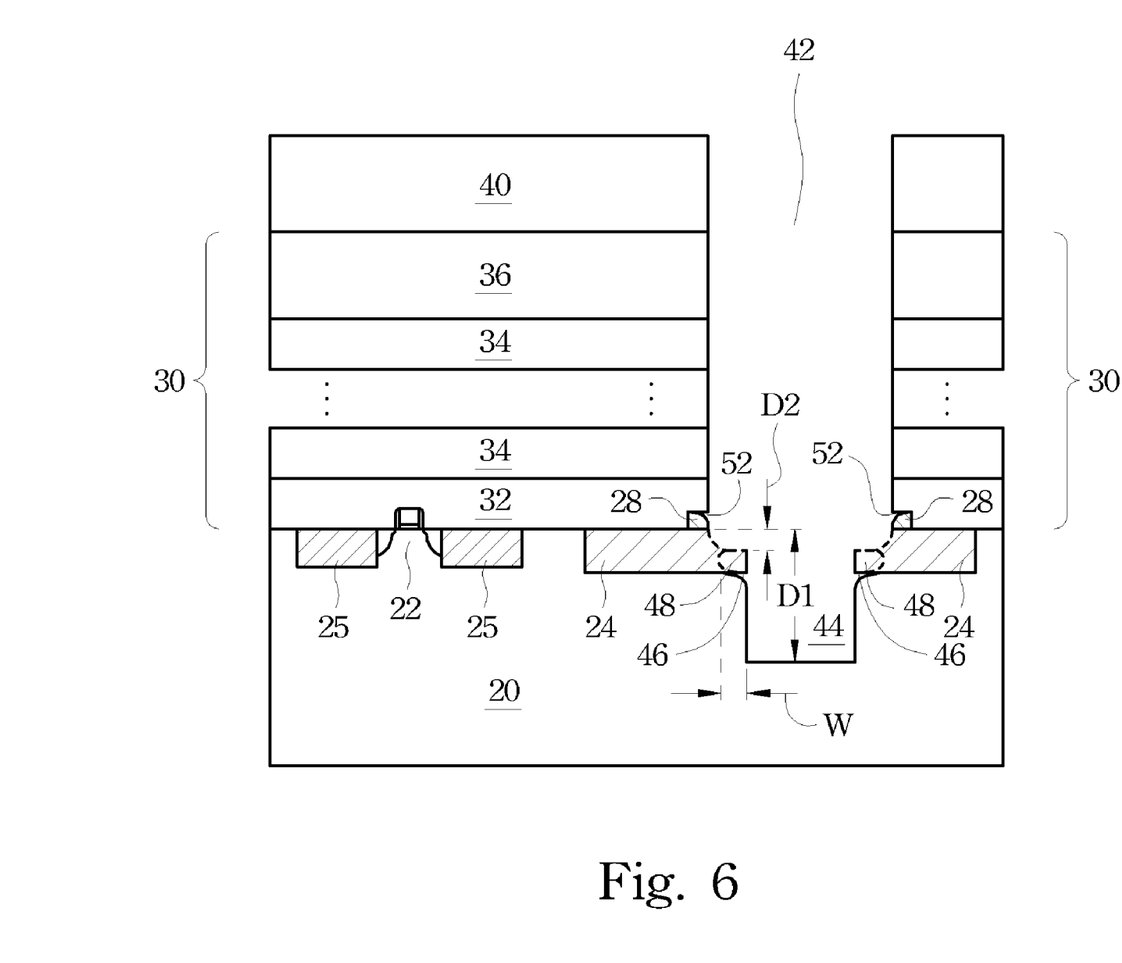

Referring to FIG. 5, after the exposure of polysilicon plate 28 is detected, the etching process is changed to etch polysilicon plate 28. Substrate 20 and STI regions 24 are then exposed. Next, the etching is continued to etch exposed substrate 20, forming TSV opening 44, as is shown in FIG. 6. The etching of polysilicon plate 28 and substrate 20 may be performed in a single step or separate steps.

Preferably, there is a high etching selectivity, preferably greater than about 80 to 1 between substrate 20 (as well as polysilicon plate 28) and STI region 24. In addition, the etching recipe for etching substrate 20 is adjusted to at least maintain, or even increase, the selectivity. In an exemplary embodiment, the selectivity is about 80 to 1, which means if substrate 20 is etched by 80 µm, STI region 24 will only be etched by about 1 µm. As illustrated in FIG. 5, since portions of STI region 24 is exposed through opening 42, during the etching of substrate 20, the exposed portion of STI region 24 is also etched, as is shown in FIG. 6. However, the etching of STI region 24 is in a significant smaller rate then etching substrate 20. As a result, the exposed portions of STI region 24 act as a hard mask, preventing the underlying portion of substrate 20 from being etched. Due to the high selectivity, a ratio of the depth D1 of etched substrate 20 to depth D2 of etched STI region 24 is close to the selectivity.

It is appreciated that undercuts 46 may be formed under STI region 24. However, the etching process may be substantially anisotropic to reduce width W of undercuts 46. Also, undercuts 52 may be formed in polysilicon plate 28. However, since polysilicon plate 28 is thin, the width of undercuts 52 is limited. Furthermore, polysilicon plate 28 may have a diameter D2 only slightly greater than width D4 of opening 42 (refer to FIG. 4B), so that even if polysilicon plate 28 is fully etched, undercuts 52 in polysilicon plate 28 still have a small width.

Figure 7:
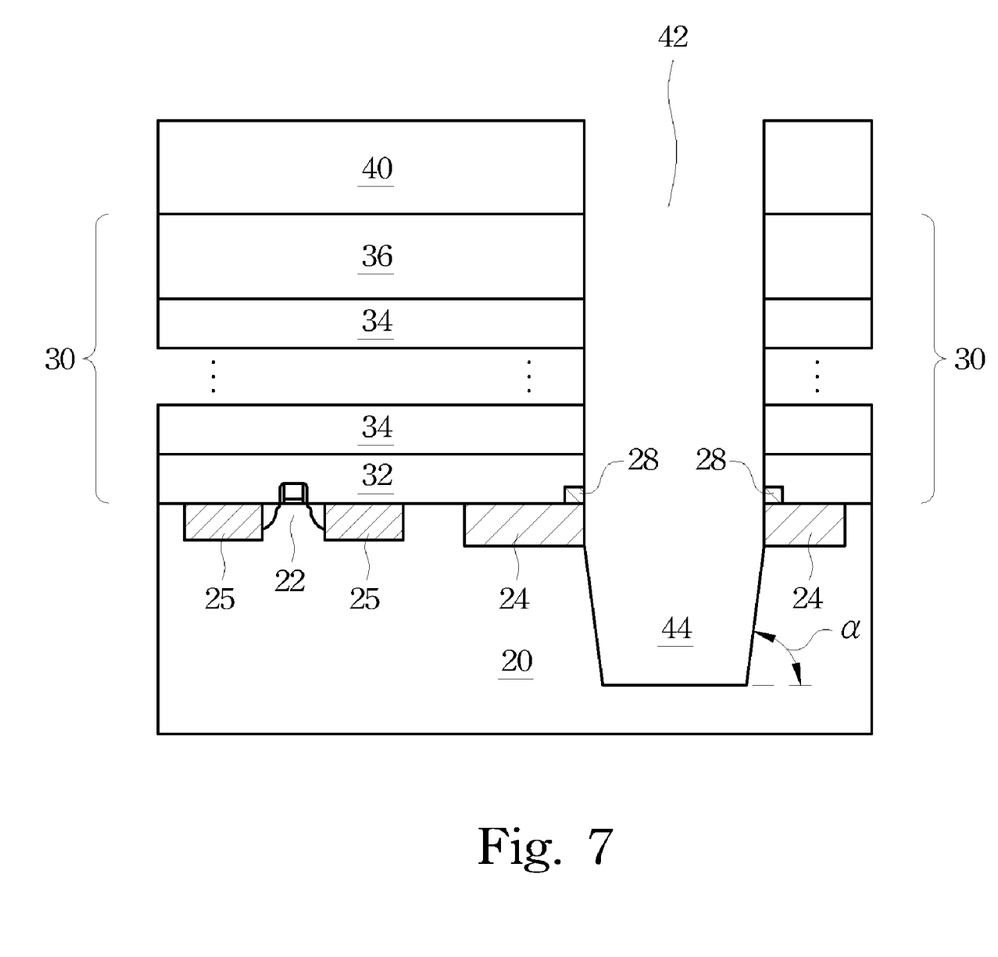

Referring to FIG. 7, with the continued etching, eventually, the remaining exposed portions 48 (refer to FIG. 6) of STI region 24 are etched through. As a result, the portions of substrate 20 protected by STI portions 48 are exposed to the etching. In an exemplary embodiment, wherein thickness T1 of STI region 24 is 0.3 μm and the selectivity is 80 to 1, the etch-through of STI region 24 occurs when the depth D1 of opening 44 is about 0.3 μm*80, which is about 24 μm. In the continued etching of substrate 20 following the etch-through of STI region 24, depth D1 of TSV opening 44 increases. Simultaneously, the previously masked portion of substrate 20 is etched gradually. The resulting opening 44 will thus be tapered. Preferably, the tilt angle α of the sidewalls of opening 44 is preferably between about 87 degrees and about 88 degrees. Tilt angle α may be adjusted by adjusting the widths D1, D2, D4 (refer to FIG. 4B), and the etching recipe. One skilled in the art will be able to find optimum values through experiments.

Advantageously, when the remaining STI portions 48 (refer to FIG. 6) are substantially fully etched, the previously formed undercuts 46 are eliminated since undercuts 46 are merged into opening 44. This significantly reduces the width of the overall undercut. As a result, opening 44 has a desirable tapered profile and significantly reduced undercuts. After Opening 44 is formed, photo resist 40 is removed.

Figure 8:
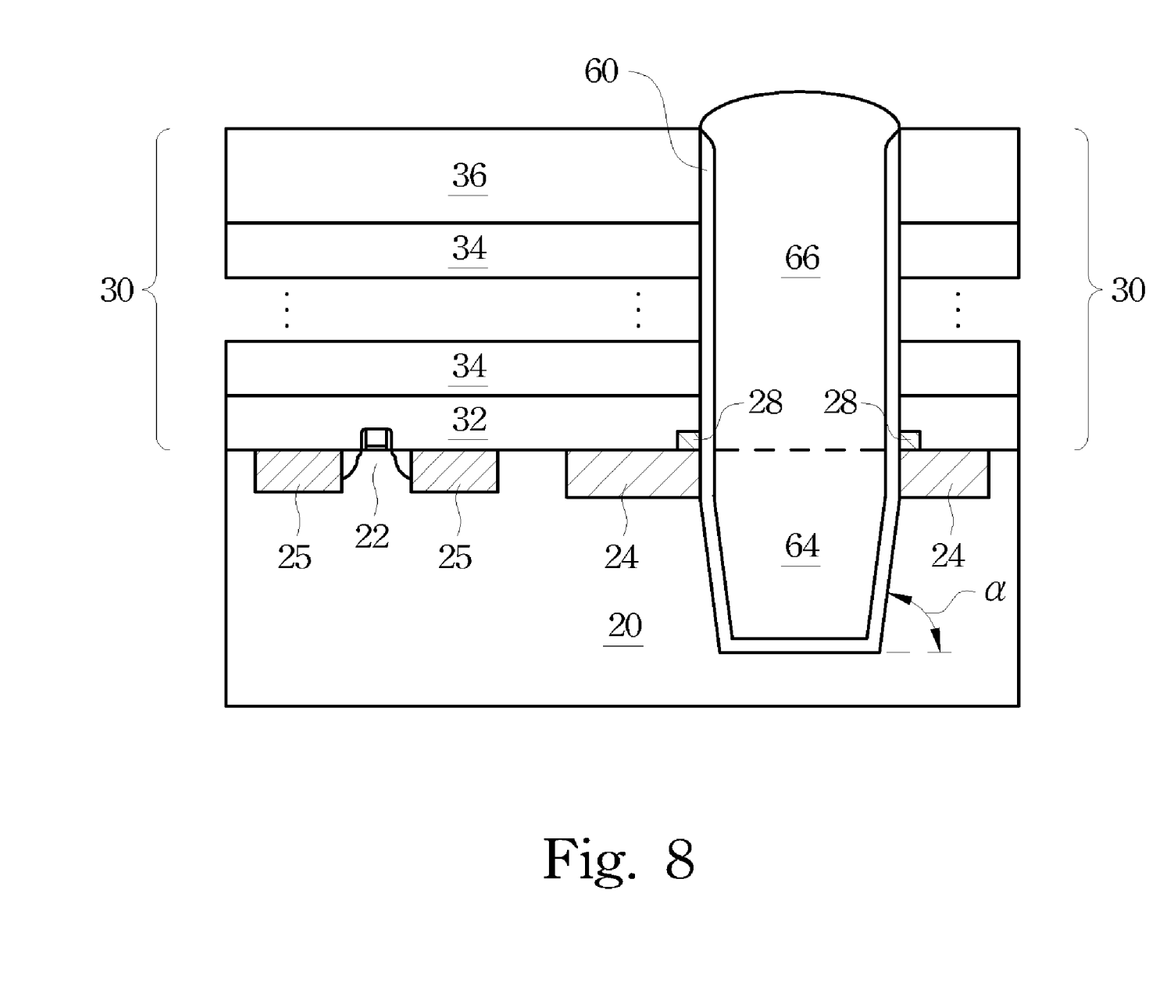

FIG. 8 illustrates the filling of openings 42 and 44. Diffusion barrier layer 60 is preferably blanket formed, covering the sidewalls of openings 42 and 44 and the bottom of opening 44. A seed layer (not shown), preferably including copper, is then formed on diffusion barrier layer 60. Diffusion barrier layer 60 may be formed using physical vapor deposition (PVD), and the seed layer may be formed using either PVD or electroless plating. Advantageously, with a tapered profile and reduced undercut, the coverage of diffusion barrier layer 60 and the seed layer is more uniform (conformal).

Next, copper is filled into the remaining portion of openings 42 and 44, preferably using electro plating. TSV 64 is thus formed in substrate 20 and metal post 66 is formed in dielectric layers 32, 34, and 36. Advantageously, with more uniformly formed diffusion barrier layer 60 and the seed layer, greater plating current can be conducted to the lower portion of opening 44, and the likelihood of forming void in TSV 64 is significantly reduced.

Figure 9:
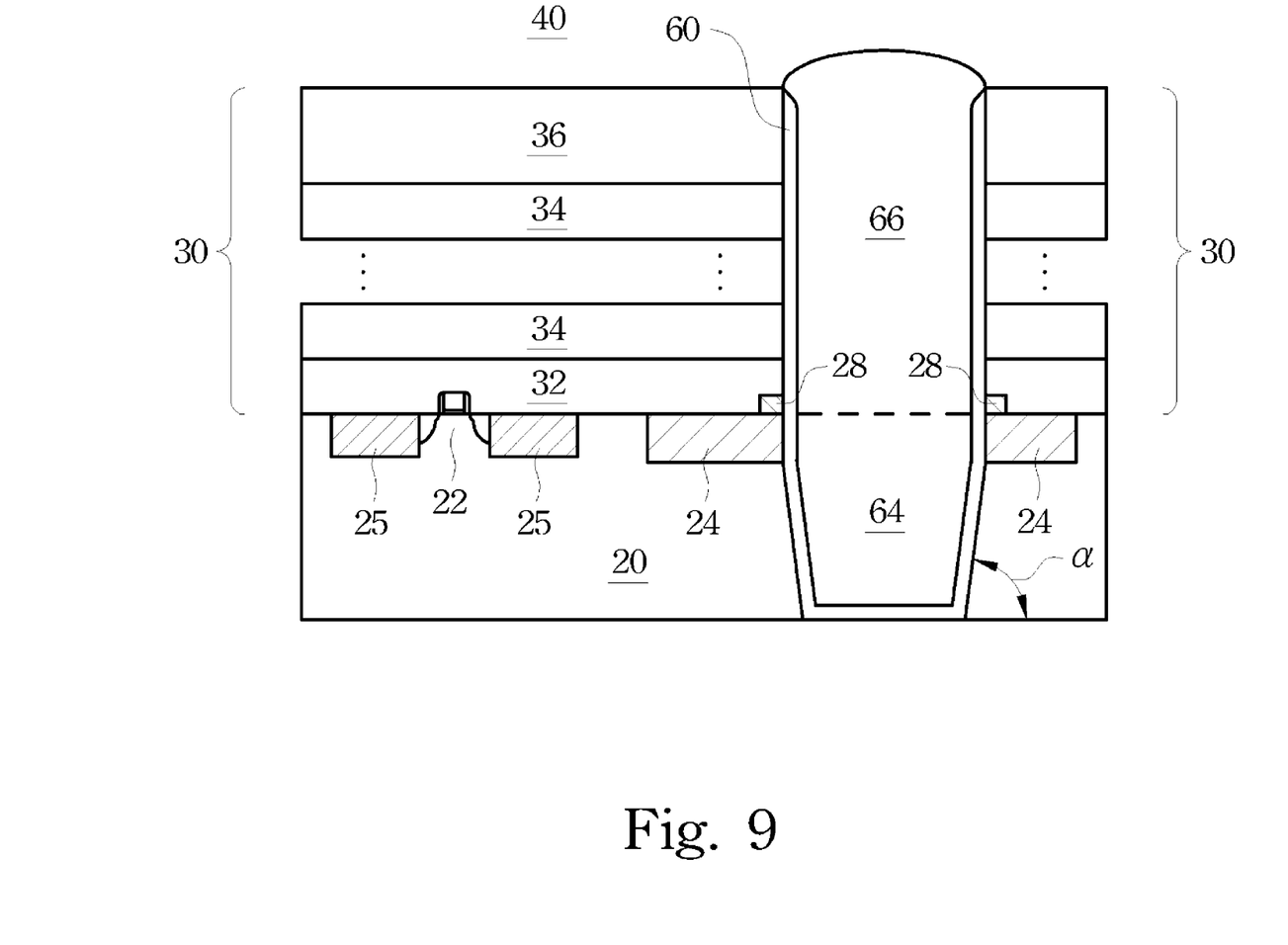

Next, as shown in FIG. 9, the backside of substrate 20 is polished, exposing TSV 64, and the packaging process may thus be performed.

Referring back to FIG. 3A, with the teaching of the previously discussed embodiments, it is appreciated that plate 28 may be formed of materials other than polysilicon, providing the etching selectivity between the materials of plate 28 and dielectric features 24, 30, 32 and 34 is high. Exemplary materials for forming plate 28 include silicon nitride film and poly salicide.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming an integrated circuit structure, the method comprising:
   providing a substrate;
   forming a hard mask extending from a top surface of the substrate into the substrate;
   forming an etch stop plate on the hard mask;
   forming low-k dielectric layers over the substrate and the etch stop plate; and
   forming a conductive feature extending from a top surface of the low-k dielectric layers into the substrate, wherein the conductive feature comprises a first portion in the low-k dielectric layers and a second portion penetrating through the etch stop plate and the hard mask.

2. The method of claim 1, wherein the step of forming the conductive feature comprises:
   etching the low-k dielectric layers to form an opening, wherein the etching stops on the etch stop plate;
   etching the etch stop plate;
   etching the substrate and an inner portion of the hard mask exposed through the opening;
   after the inner portion of the hard mask is etched through, continuing etching the substrate to extend the opening into the substrate; and
   filling the opening with a conductive material to form a through-silicon via (TSV) in the substrate.

3. The method of claim 2, wherein during the step of etching the substrate, the substrate and the hard mask have an etching ratio, and wherein the etching ratio times a thickness of the hard mask is less than a height of the TSV.

4. The method of claim 2, wherein the step of etching the substrate and the inner portion of the hard mask is anisotropic.

5. The method of claim 1, wherein a thickness of the hard mask is less than about 1 μm.

6. The method of claim 1, wherein the etch stop plate comprises polysilicon.

7. The method of claim 1, wherein a portion of the conductive feature in the substrate has a tapered profile with an upper portion wider than a lower portion.

8. The method of claim 1, wherein the hard mask is a shallow trench isolation (STI) region.

9. The method of claim 8, wherein the STI region is simultaneously formed with additional STI regions, and wherein the additional STI regions isolate integrated circuit devices.

10. A method for forming an integrated circuit structure, the method comprising:
    providing a substrate;
    forming a shallow trench isolation (STI) region extending from a top surface of the substrate into the substrate, wherein the STI region encircles a top portion of the substrate;
    forming a plate on the substrate and the STI region, wherein the plate covers the top portion of the substrate encircled by the STI region;
    forming dielectric layers over the substrate, the STI region, and the plate;

forming an opening in the dielectric layers using the plate as an etch stop layer, wherein an inner portion of the plate is exposed through the opening; and etching the plate and the substrate through the opening.

11. The method of claim 10, wherein the substrate and the STI region have a high etching selectivity in the step of etching the substrate.

12. The method of claim 10, wherein the step of etching the plate and the substrate is substantially anisotropic.

13. The method of claim 12, wherein the step of forming the opening is partially isotropic.

14. The method of claim 10, wherein the dielectric layers are low-k dielectric layers.

15. The method of claim 10, wherein before the step of etching the plate and the substrate through the opening, the portion of the substrate encircled by the STI region has a width less than a width of the opening.

16. The method of claim 10, wherein the opening has a bottom width less than an outer width of the STI region, and greater than an inner width of the STI region.

17. The method of claim 10, wherein the plate has a thickness of less than about 1 μm.

18. The method of claim 10, wherein a thickness of the STI region is less than about 1 μm.

19. The method of claim 10 further comprising, after an inner portion of the STI region is etched through, continuing etching the substrate.

20. The method of claim 10 further comprising filling the opening with a conductive material.

* * * * *